(12) United States Patent
Tanaka et al.

(10) Patent No.: US 7,833,856 B2
(45) Date of Patent: Nov. 16, 2010

(54) SEMICONDUCTOR DEVICE AND METHOD OF MANUFACTURING SAME

(75) Inventors: Masayuki Tanaka, Yokohama (JP); Hirokazu Ishida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 161 days.

(21) Appl. No.: 11/802,114

(22) Filed: May 21, 2007

(65) Prior Publication Data

US 2007/0267682 A1    Nov. 22, 2007

(30) Foreign Application Priority Data

May 22, 2006    (JP)    ............................. 2006-142034

(51) Int. Cl.
*H01L 21/8238*    (2006.01)
*H01L 21/336*    (2006.01)
*H01L 29/423*    (2006.01)

(52) U.S. Cl. ........................ 438/201; 438/211; 438/212; 438/257; 257/E29.129

(58) Field of Classification Search .................. 438/142, 438/197, 257, 201, 211, 212; 257/E29.129
See application file for complete search history.

(56) References Cited

U.S. PATENT DOCUMENTS

| | | | |
|---|---|---|---|
| 6,406,960 B1 | 6/2002 | Hopper et al. | |
| 7,187,029 B2 * | 3/2007 | Sugita et al. | 257/320 |
| 7,510,935 B2 * | 3/2009 | Lee et al. | 438/261 |
| 2003/0222318 A1 * | 12/2003 | Tanaka et al. | 257/406 |
| 2004/0251521 A1 * | 12/2004 | Tanaka et al. | 257/639 |
| 2005/0212036 A1 * | 9/2005 | Tanaka et al. | 257/316 |

FOREIGN PATENT DOCUMENTS

| | | |
|---|---|---|
| CN | 1467799 A | 1/2004 |
| JP | 9-64205 | 3/1997 |
| JP | 11-103033 | 4/1999 |
| JP | 11-261038 | 9/1999 |
| KR | 2000-0032396 | 6/2000 |

OTHER PUBLICATIONS

Notification of the First Office Action mailed Jul. 25, 2008, from the Chinese Patent Office in counterpart Chinese Application No. 2007101048351.

Notification for Filing Opinion mailed Mar. 11, 2009, from the Korean Patent Office in counterpart Korean Application No. 10-2007-49122, and English language translation thereof.

* cited by examiner

*Primary Examiner*—Luan C Thai
(74) *Attorney, Agent, or Firm*—Finnegan, Henderson, Farabow, Garrett & Dunner, L.L.P.

(57) ABSTRACT

According to an aspect of the invention, there is provided a semiconductor device comprising a semiconductor substrate, a first insulating layer formed on the semiconductor substrate, a first conductive layer formed as a floating gate on the first insulating layer, a second insulating layer formed as an inter-electrode insulating film on the first conductive layer, and comprising three layers of a first film mainly including silicon and oxygen, a second film mainly including silicon and nitrogen, and a third film mainly including silicon and oxygen, wherein a silicon and nitrogen composition ratio of the second film is in a state in which the silicon is in excess of a stoichiometric composition, and a second conductive layer formed as a control gate on the second insulating film.

7 Claims, 5 Drawing Sheets

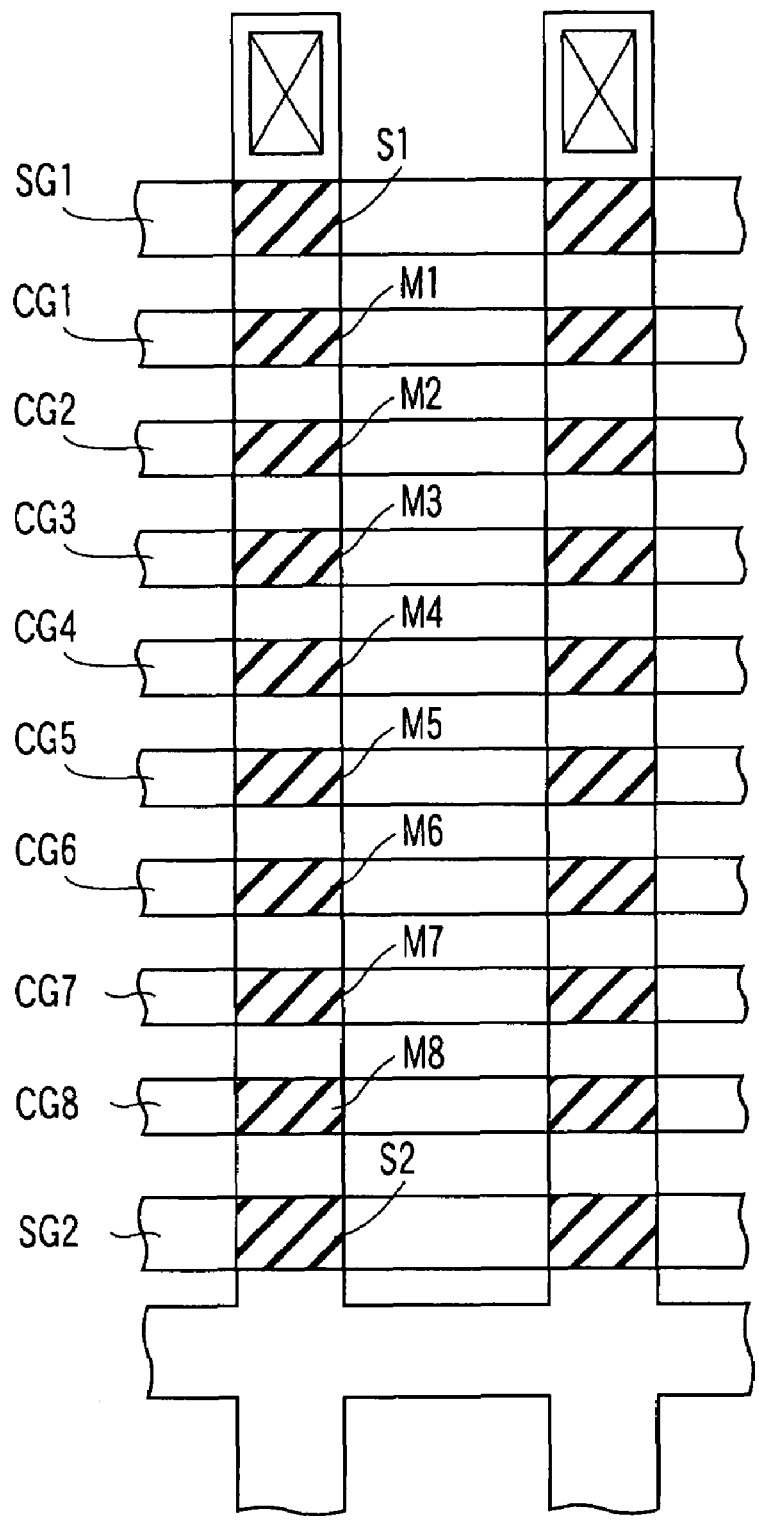
F I G. 1

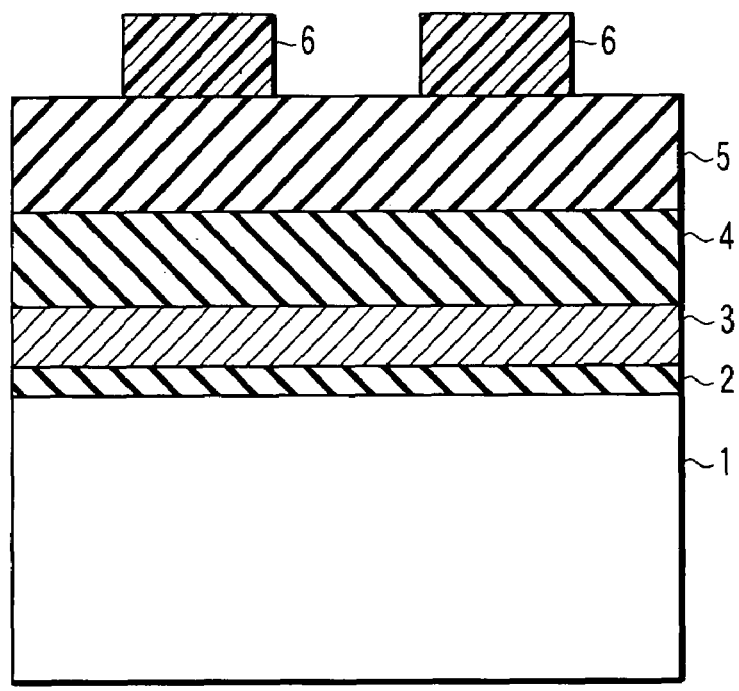
F I G. 3
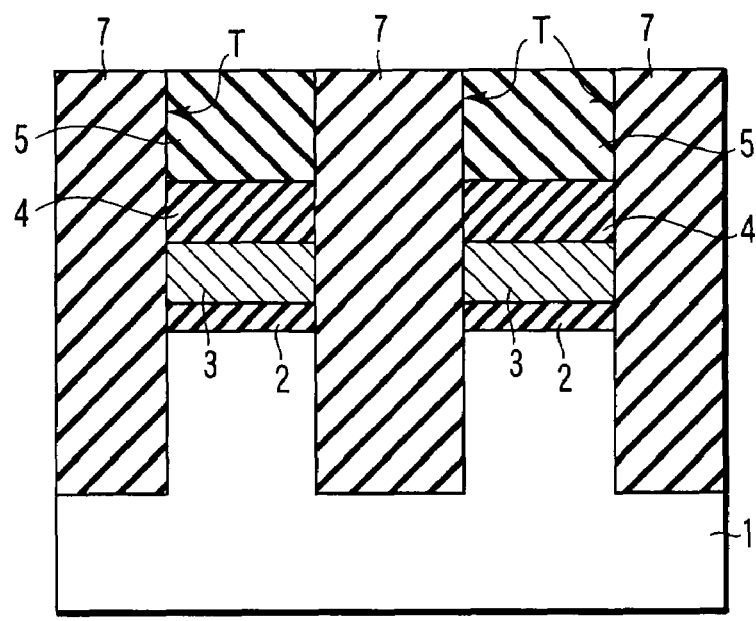
F I G. 4

US 7,833,856 B2

SEMICONDUCTOR DEVICE AND METHOD OF MANUFACTURING SAME

CROSS-REFERENCE TO RELATED APPLICATIONS

This application is based upon and claims the benefit of priority from prior Japanese Patent Application No. 2006-142034 filed May 22, 2006, the entire contents of which are incorporated herein by reference.

BACKGROUND OF THE INVENTION

1. Field of the Invention

The present invention relates to a semiconductor device and a method of manufacturing the same, and more particularly to a nonvolatile semiconductor memory device.

2. Description of the Related Art

Interference has increased between adjacent cells along with miniaturization of a nonvolatile semiconductor memory device, necessitating reduction in the thickness of an ONO film (including oxide, nitride and oxide films) applied as an interelectrode insulating film in consequence.

When high electric-field stress is applied to the ONO film as the interelectrode insulating film to carry out writing or erasing, electron trapping occurs in the nitride film of the ONO film. There is a characteristic that an increase in own electric field of the nitride film caused by the electron trapping results in a reduction of an electric field applied to the ONO film, thereby improving leakage characteristics.

Reducing the thickness of the ONO film is difficult when it is carried out by reducing the thickness of the oxide film to provide device reliability. Thus, the ONO film is made thinner by reducing the thickness of the nitride film. However, making the nitride film thinner reduces the number of trapped electrons, and provides unsatisfactory electric field reduction, causing a problem of increased leakage current.

Jpn. Pat. Appln. KOKAI Publication No. 11-261038 discloses a configuration of a memory transistor which includes a semiconductor substrate having a channel forming region, an isolation insulating film buried in a trench formed in the semiconductor substrate to isolate the channel forming region, a tunnel insulating film formed on the channel forming region, a floating gate formed on the tunnel insulating film and having at least two opposed ends formed higher than a part between the ends, an intermediate insulating film formed to cover the entire surface of the floating gate, a control gate formed on the intermediate insulating film, and a source/drain region formed to be connected with the channel forming region.

Jpn. Pat. Appln. KOKAI Publication No. 11-103033 discloses a method which includes forming a pad section for a floating gate electrode by patterning a CVDSiO$_2$ film/polysilicon film, forming a trench in a semiconductor substrate surface by using the floating gate electrode pad having HTO and Si$_3$N$_4$ films deposited therein as a mask, and forming a thick thermal oxide film by thermal oxidation so that an interface position between the oxide film on the trench and the semiconductor substrate can be on a channel center side more than the end of the floating gate electrode pad.

Jpn. Pat. Appln. KOKAI Publication No. 9-64205 discloses a method which includes forming a silicon nitride film, and then adding silicon (Si), nitrogen (N) or oxygen (O) to the silicon nitride film.

BRIEF SUMMARY OF THE INVENTION

According to an aspect of the invention, there is provided a semiconductor device comprising: a semiconductor substrate; a first insulating layer formed on the semiconductor substrate; a first conductive layer formed as a floating gate on the first insulating layer; a second insulating layer formed as an interelectrode insulating film on the first conductive layer, and comprising three layers of a first film mainly including silicon and oxygen, a second film mainly including silicon and nitrogen, and a third film mainly including silicon and oxygen, wherein a silicon and nitrogen composition ratio of the second film is in a state in which the silicon is in excess of a stoichiometric composition; and a second conductive layer formed as a control gate on the second insulating film.

According to another aspect of the invention, there is provided a method for manufacturing a semiconductor device, comprising: forming a first insulating layer on a semiconductor substrate; forming a first conductive layer as a floating gate on the first insulating layer; forming a second insulating layer as an interelectrode insulating film on the first conductive layer, which comprises a film mainly including silicon and nitrogen and having a composition ratio between the silicon and the nitrogen where silicon is in excess of a stoichiometric composition; and forming a second conductive layer as a control gate on the second insulating layer.

BRIEF DESCRIPTION OF THE SEVERAL VIEWS OF THE DRAWING

FIG. 1 is a plan view schematically showing a configuration of a semiconductor device according to an embodiment of the present invention;

FIG. 3 is a structure sectional view showing a manufacturing process of the semiconductor device of the embodiment;

FIG. 4 is a structure sectional view showing the manufacturing process of the semiconductor device of the embodiment;

DETAILED DESCRIPTION OF THE INVENTION

The embodiment of the present invention will be described below with reference to the accompanying drawings. The embodiment will be described by way of example of a NAND-type flash memory as a nonvolatile semiconductor memory device which enables electrical erasure of data.

Figure 2:
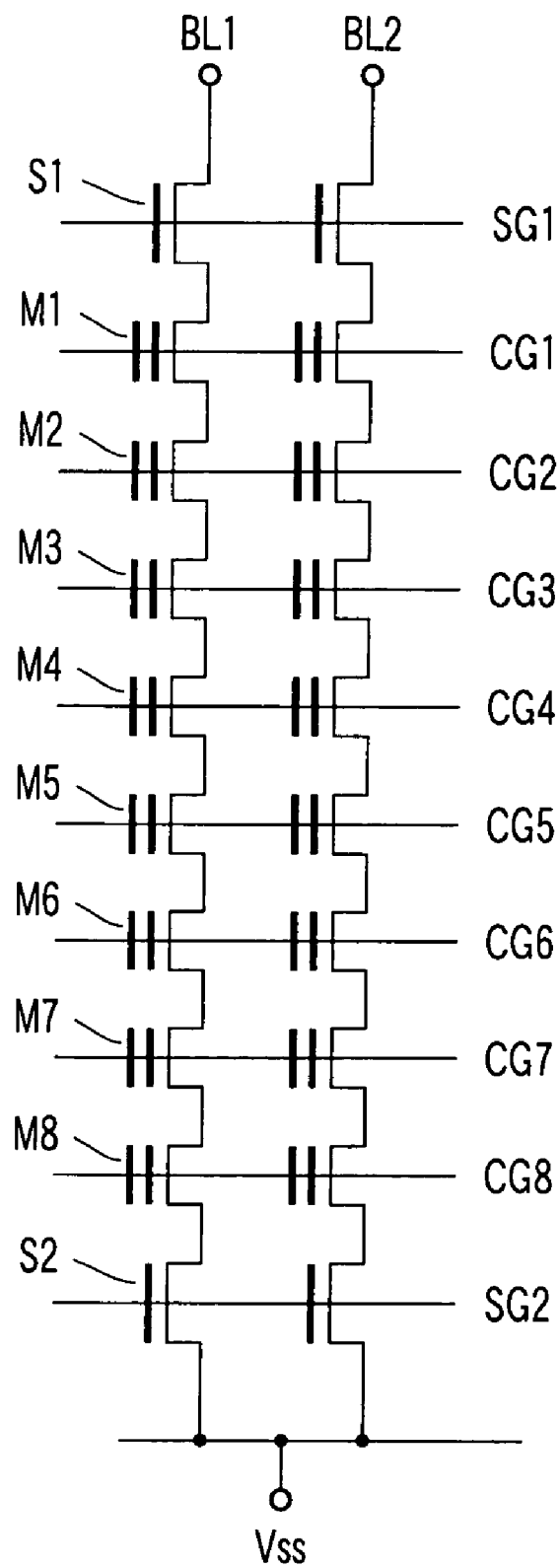
FIG. 2 is a view showing an equivalent circuit of the semiconductor device of the embodiment.

FIG. 1 is a plan view schematically showing a rough configuration of the NAND-type flash memory of the embodiment (no bit line is shown). FIG. 2 shows an equivalent circuit of the configuration shown in FIG. 1.

As shown in FIGS. 1 and 2, each NAND cell unit includes memory cells M1 to M8 serially connected between selection transistors S1 and S2. Selection gate lines SG1 and SG2 are connected to the selection transistors S1 and S2, and control gate lines (word lines) CG1 to CG8 are connected to the memory cells M1 to M8. Bit lines BL1 and BL2 are connected to each selection transistor S1. A case in which there are eight memory cells is described here. However, the number of memory cells is not limited to eight.

FIGS. 3 to 6, and FIGS. 8 and 9 are structure sectional views showing a manufacturing process of the semiconductor device of the embodiment. Referring to FIGS. 3 to 6, and FIGS. 8 and 9, the manufacturing process of the semiconductor device of the embodiment will be described. In the semiconductor device of the embodiment, memory cells including floating and control gates stacked on a semiconductor substrate are arrayed, thereby constituting the NAND-type flash memory.

First, as shown in FIG. 3, a first insulating film (first gate insulating film) 2 is formed with a thickness of about 1 to 15 nm on a p type silicon substrate (semiconductor substrate) 1 (or substrate having a p type well formed on an n type silicon substrate), and a first conductive layer (floating gate) 3 which becomes a charge storage layer is formed with a thickness of about 10 to 200 nm on the first insulating film 2 by a chemical vapor growth method.

Next, a silicon nitride film 4 is formed with a thickness of about 50 to 200 nm on the first conductive layer 3 by a chemical vapor growth method, and a silicon oxide film 5 is formed with a thickness of about 50 to 400 nm on the silicon nitride film 4 by a chemical vapor growth method. A photoresist 6 is applied on the silicon oxide film 5, and the photoresist 6 is patterned by exposure drawing.

Next, the silicon oxide film 5 is etched by using the photoresist 6 of FIG. 3 as an etching resistance mask. The photoresist 6 is removed after etching, and the silicon nitride film 4 is etched by using the silicon oxide film 5 as a mask. The first conductive layer 3, the first insulating film 2, and the silicon substrate 1 are etched to form a trench for isolation. After the etching, a high-temperature post oxidation process is carried out to remove damage of a section formed by the etching.

Then, as shown in FIG. 4, a buried insulating film 7 such as a silicon oxide film is formed with a thickness of 200 to 1500 nm to fill the isolation trench. The buried insulating film 7 is subjected to a high-temperature heat process in a nitrogen or oxygen atmosphere to be made high in density. Next, the silicon nitride film 4 is used as a stopper in accordance with chemical mechanical polishing method (CMP) to flatten the insulating film 7.

Figure 5:
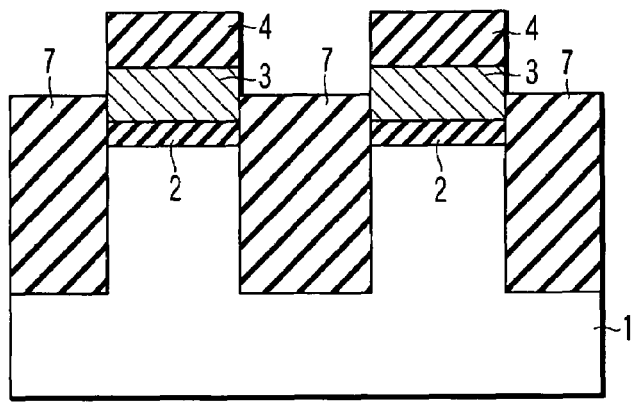
FIG. 5 is a structure sectional view showing the manufacturing process of the semiconductor device of the embodiment.

Then, as shown in FIG. 5, the silicon oxide film 7 is removed by using a method of etching which has a selection ratio with the silicon nitride film 4. The embodiment shows a case in which the silicon oxide film 7 is removed until a height of its surface after the removal is equal to that of a film thickness about half of the first conductive layer 3. Subsequently, the silicon nitride film 4 is removed by a method having a selection ratio with the silicon oxide film 7.

Figure 6:
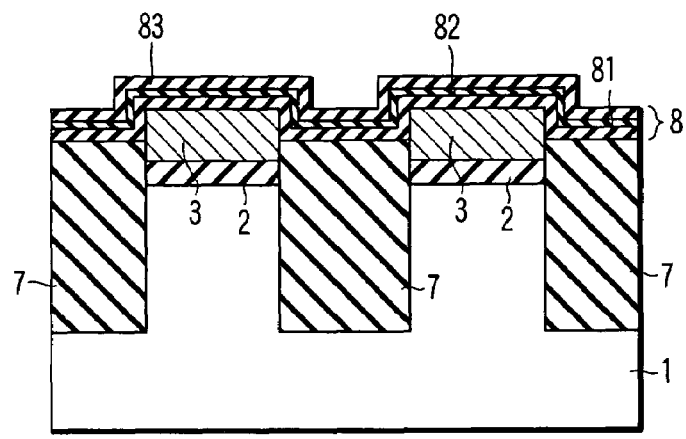
FIG. 6 is a structure sectional diagram showing the manufacturing process of the semiconductor device of the embodiment.

Then, as shown in FIG. 6, an interelectrode insulating film (second gate insulating film) 8 is formed on a substrate of a structure in which the silicon nitride film 4 of FIG. 5 has been removed. The interelectrode insulating film 8 includes three layers of interpoly insulating films. On the substrate, a silicon oxide film ($SiO_2$ film) 81 is formed with a thickness of 0.5 to 10 nm, preferably 2 to 5 nm, by the CVD method. On the silicon oxide film 81, a silicon nitride film (SiN film) 82 is formed with a thickness of 0.5 to 15 nm, preferably 1 to 8 nm, by the CVD method. On the silicon nitride film 82, a silicon oxide film ($SiO_2$ film) 83 is formed with a thickness of 0.5 to 10 nm, preferably 2 to 5 nm, by the CVD method.

Here, a method of forming the silicon nitride film 82 will be described below in detail. The silicon nitride film 82 is formed by introducing hexachlorodisilane (HCD) as a silicon raw material and ammonia ($NH_3$) as a nitrogen raw material into a reactor under a reduced pressure at an in-reactor temperature of 350° C. to 850° C., preferably 400 to 700° C. A flow ratio between the hexachlorodisilane and the ammonia (flow ratio=ammonia flow rate/hexachlorodisilane flow rate) is within a range of 5 to 20. An in-reactor pressure is 10 mTorr to 10 Torr during deposition.

Figure 7:
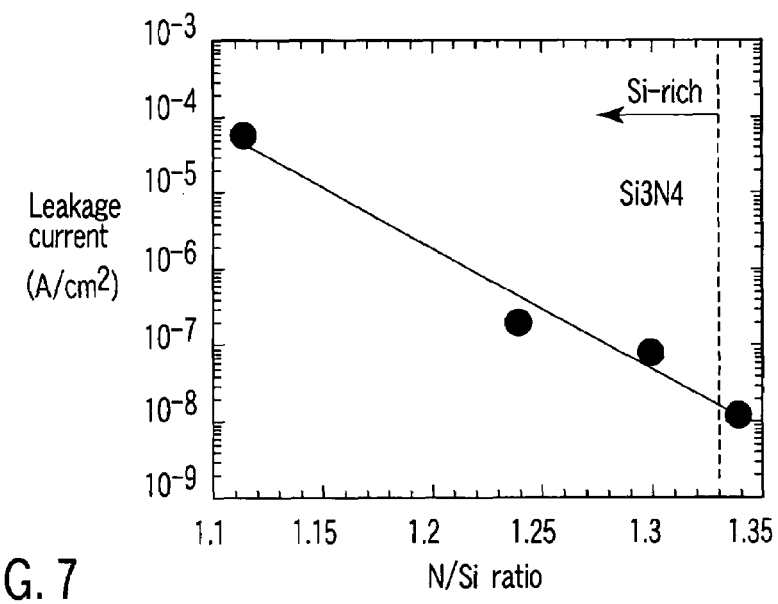
FIG. 7 is a view showing a relation between a composition ratio of a silicon nitride film and a leakage current according to the embodiment.

FIG. 7 shows a relation between a composition ratio of a silicon nitride film and a leakage current per electric field of 2 MV/cm. When HCD having Si—Si coupling is used as a silicon raw material, a silicon nitride film to be formed has an Si-rich (excessive silicon) composition. A result of measuring a composition ratio of the silicon nitride film and a leakage current of the silicon nitride film shown in FIG. 7 shows that the leakage current of the silicon nitride film is larger as the composition is richer in Si, increasing electron trap sites as leakage paths.

As shown in FIG. 6, the interelectrode insulating film 8 is formed to prevent extraction of electrons/holes to be injected into the first conductive layer 3 in an electric field during writing or erasing to a control electrode side, and has to satisfy desired leakage specifications. The interelectrode insulating film 8 has a three-layer structure in which upper and lower sides of the silicon nitride film 82 are held between the silicon oxide films 81, 83.

When a high electric field is applied during writing or erasing, a leakage current flows through the interelectrode insulating film 8. However, some charges are trapped in the silicon nitride film 82 to weaken the electric field of the application direction. The leakage current through the interelectrode insulating film 8 increases or decreases charges trapped in the silicon nitride film 82. Accordingly, as obvious from FIG. 7, it is effective to form a film having a composition ratio of nitrogen to silicon set smaller than a stoichiometric composition (N/Si=1.33), for example, a film having a composition ratio smaller than 1.30, as the silicon nitride film 82 in the interelectrode insulating film 8.

However, when a composition ratio is extremely rich in Si, specifications of a leakage current value necessary during a device operation cannot be satisfied. According to the embodiment, no problem occurs in the device operation in the case of a silicon nitride film having an N/Si composition ratio larger than 1.10. When an N/Si composition ratio is equal to or less than 1.10, an increase in trapping further increases a leakage current of the SiN film. The increased leakage current of the interelectrode insulating film pushes electrons injected into a floating gate during a writing operation through the interelectrode insulating film to a control electrode side, disabling retention of the electrons in the floating gate. Thus, a problem of disabled writing up to a desired threshold value occurs. To obtain satisfactory electric field reduction by electron trapping, the N/Si composition ratio should preferably be set smaller than 1.30.

According to the embodiment, the number of trapped electrons in the Si-rich silicon nitride film 82 depends on the thickness of the silicon nitride film 82. There is a possibility that trapped charges will be detrapped to an electrode side or in an adjacent cell direction during charge holding to change a cell threshold value. A degree of deterioration due to the detrapping becomes larger as the SiN film becomes thicker. Thus, characteristic deterioration by the detrapping can be suppressed by setting the thickness of the SiN film to be equal to or less than 8 nm, preferably 6 nm or less.

The formation of the SiN film with a thickness of 1 nm or more, preferably 2.5 nm or more, permits easily realizing a withstanding pressure which prevents destruction during a writing operation. Accordingly, to suppress characteristic deterioration due to the detrapping by reducing a leakage current, it is effective to set an N/Si composition ratio to be larger than 1.10 and smaller than 1.30, and to form the silicon nitride film 82 with a thickness of 1 to 8 nm, more preferably within a range of 2.5 to 6 nm.

The deposition method of the embodiment based on HCD and ammonia has been described as the method of forming the Si-rich silicon nitride film. However, other methods can be employed.

For example, dichlorosilane (DCS) and ammonia are introduced respectively as a silicon raw material and a nitrogen raw material into a reactor to form the Si-rich silicon nitride film under a reduced pressure at an in-reactor temperature of 350 to 850° C. A deposition pressure is 10 mTorr to 10 Torr during deposition. In this case, a ratio between the ammonia and the DCS introduced into the reactor is set smaller than a stoichiometric composition (N/Si=1.33) of $Si_3N_4$ so that a silicon nitride film to be formed can have an Si-rich composition. In other words, by setting a flow ratio between a flow rate of ammonia and a flow rate of DCS smaller than 1.33, nitriding does not progress so much because of a small supply amount of nitrogen. Hence, a silicon nitride film having an Si-rich composition ratio can be formed. A flow ratio between dichlorosilane and ammonia (flow ratio=ammonia flow rate/dichlorosilane flow rate) is within a range of 0.1 to 1.33.

When silane is used as a silicon raw material, an Si-rich silicon nitride film is easily formed because of a high silicon reactivity. Even if a flow ratio between an ammonia flow rate and a silane flow rate is about 15 or less, an Si-rich silicon nitride film can be formed.

The embodiment has been described by way of example in which the three layers of the interpoly insulating film are all formed by the CVD method. However, similar effects can be obtained in interpoly insulating films formed by other methods. For example, the silicon oxide film 81 (Btm-SiO$_2$ film) can be formed by oxidizing the first conductive layer 3. The film can be formed by oxidation through the silicon nitride film formed on the first conductive layer 3. A silicon oxide film 83 (Top-SiO$_2$ film) can be formed by oxidizing the silicon oxide film 81 and the silicon nitride film 82 (ON film) formed on the first conductive layer 3. Similar effects can be obtained in interpoly insulating films formed by any of these methods.

The embodiment has been described by way of application example of the three-layer structure which includes the ONO film as the interelectrode insulating film. However, the embodiment is not limited to this example. For example, in the case of an interelectrode insulating film having silicon nitride films formed in both of upper and lower interfaces (an interface between the first conductive layer 3 and the silicon oxide film 81 and an interface between the second conductive layer 9 and the silicon oxide film 83) of the three-layer structure, or an interelectrode insulating film having a silicon nitride film formed in one of them, the same effects as those of the embodiment can be obtained. For example, the silicon nitride films of the upper and lower interfaces of the three-layer structure can be formed with a thickness of 2 nm or less to suppress formation of bird's beak during oxidation. The silicon nitride film 82 may contain $1\times10^{19}$ cm$^{-3}$ or more of chlorine. The inclusion of chlorine in the SiN film enables suppression of deterioration with respect to a withstanding pressure of the SiN film and electrical stress. Hydrogen is present in the SiN film, and coupled with Si or N to exist as SiH or NH. In the NAND cell, repeated writing or erasing applies electrical stress on the interelectrode insulating film. Electrical stress is applied on the electrodes by several thousands times or more with both polarities of positive and negative biases. Under these conditions, the hydrogen in the film is disconnected to be released from the film, increasing leakages while leaving defects in the film. When there is $1\times10^{19}$ cm$^{-3}$ or more of chlorine in the SiN film, deterioration caused by the repeated electrical stress application can be suppressed. This may be because when the SiN film contains chorine of a large electronegativity, the hydrogen in the SiN film can be stabilized to reduce the amount of hydrogen released from the film by electrical stress.

Figure 8:
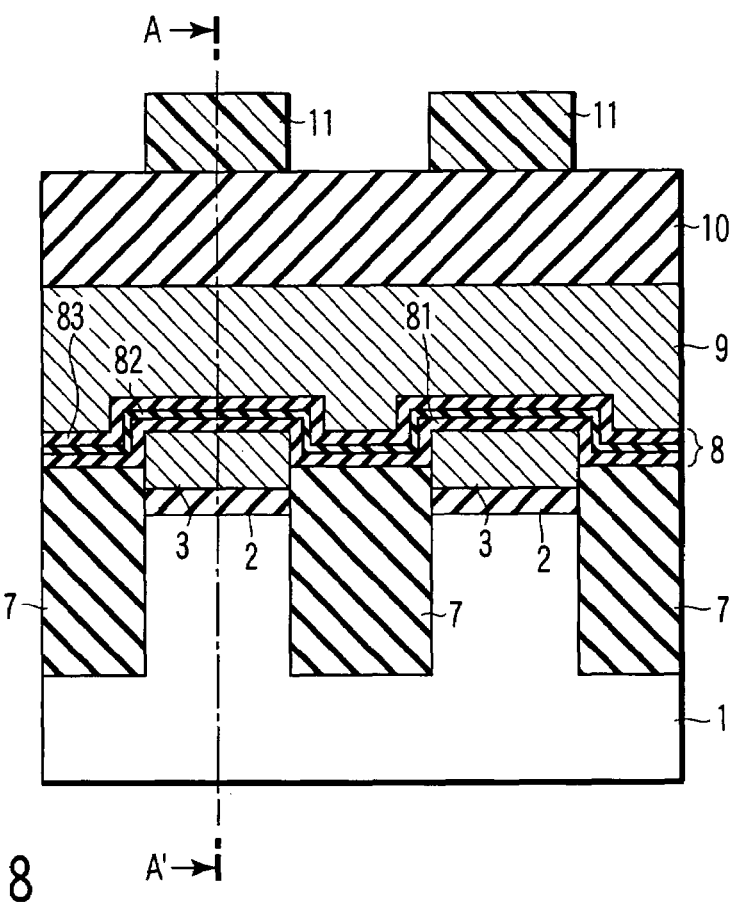
FIG. 8 is a structure sectional diagram showing the manufacturing process of the semiconductor device of the embodiment.

Then, as shown in FIG. 8, a second conductive layer (control gate) 9 is formed with a thickness of 10 to 200 nm on the interelectrode insulating film 8. The second conductive layer 9 is a control electrode in the NAND-type flash memory. A mask material 10 is formed on the second conductive layer 9. Subsequently, a photoresist 11 is applied on the mask material 10, and the photoresist 11 is patterned by exposure drawing.

Figure 9:
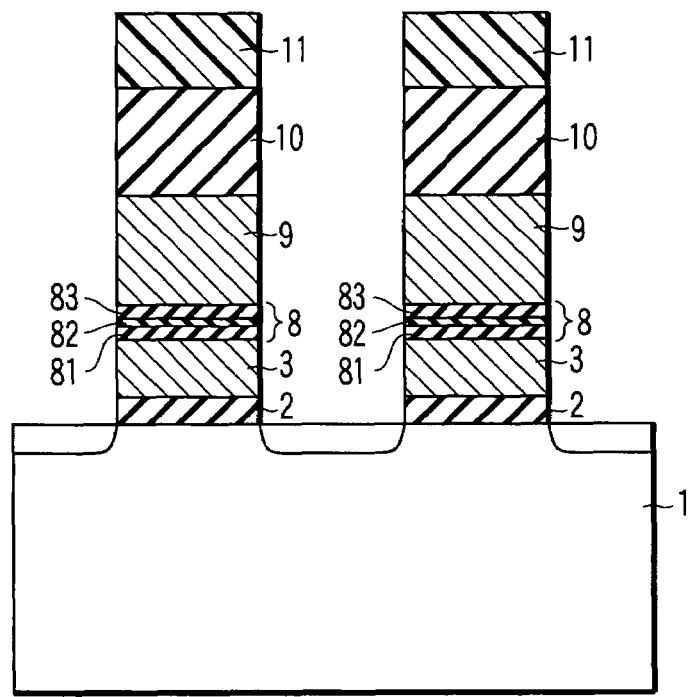
FIG. 9 is a structure sectional diagram showing the manufacturing process of the semiconductor device of the embodiment.

FIG. 9 is a structure view of a section cut on the line A-A' vertical to a paper surface of FIG. 8. As shown in FIG. 9, the mask material 10, the second conductive layer 9, the interelectrode insulating layer 8, the first conductive layer 3, and the first insulating film 2 are etched by using the photoresist 11 as a mask. After the etching, the photoresist 11 is removed.

According to the embodiment, by forming the silicon nitride film of the ONO film applied as the interelectrode insulating film of the nonvolatile semiconductor device such as the NAND device richer in Si than in the conventional case, the number of trapped electrons in the silicon nitride film can be increased even when the silicon nitride film is made thinner. As a result, it is possible to obtain satisfactory electric field reduction by electron trapping.

According to the embodiment, it is possible to provide a semiconductor device capable of preventing an increase in leakage current accompanying reduction in the thickness of an interelectrode insulating film, and a method of manufacturing the semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising:
   forming a first insulating layer on a semiconductor substrate;
   forming a first conductive layer as a floating gate on the first insulating layer;
   forming a second insulating layer on the first conductive layer;
   forming a trench for isolation by etching the second insulating layer, the first conductive layer, the first insulating layer, and the semiconductor substrate;
   forming a third insulating layer within the trench;

removing a part of the third insulating layer until a surface of the third insulating layer is lower than an upper surface of the first conductive layer but higher than a lower surface of the first conductive layer;

removing the second insulating layer;

forming a fourth insulating layer as an interelectrode insulating film on the first conductive layer and the third insulating layer; and forming a second conductive layer as a control gate on the fourth insulating layer, wherein said forming the fourth insulating layer includes:

forming a first film mainly including silicon and oxygen;

forming, on the first film, a second film mainly including silicon and nitrogen and having a composition ratio between the silicon and the nitrogen where silicon is in excess of a stoichiometric composition; and forming a third film mainly containing silicon and oxygen on the second film.

2. The method according to claim 1, wherein the second film of the fourth insulating layer has a composition ratio of nitrogen to silicon smaller than 1.30.

3. The method according to claim 1, wherein the second film of the fourth insulating layer is formed by using hexachlorodisilane and ammonia as raw materials.

4. The method according to claim 1, wherein the second film of the fourth insulating layer is formed by using dichlorosilane and ammonia as raw materials.

5. The method according to claim 1, wherein the second film of the fourth insulating layer has a composition ratio of nitrogen to silicon larger than 1.10.

6. The method according to claim 1, wherein the second film of the fourth insulating layer has a thickness of 1 to 8 nm.

7. The method according to claim 1, wherein the second film of the fourth insulating layer includes $1 \times 10^{19}$ cm$^{-3}$ or more of chlorine.

* * * * *